United States Patent
Chang et al.

(10) Patent No.: US 12,278,096 B2
(45) Date of Patent: Apr. 15, 2025

(54) SHIELD COOLING ASSEMBLY, REACTION CHAMBER AND SEMICONDUCTOR PROCESSING APPARATUS

(71) Applicant: BEIJING NAURA MICROELECTRONICS EQUIPMENT CO., LTD., Beijing (CN)

(72) Inventors: Qing Chang, Beijing (CN); Bing Li, Beijing (CN); Guodong Bian, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 265 days.

(21) Appl. No.: 17/384,240

(22) Filed: Jul. 23, 2021

(65) Prior Publication Data
US 2021/0351016 A1 Nov. 11, 2021

Related U.S. Application Data

(63) Continuation of application No. PCT/CN2020/072184, filed on Jan. 15, 2020.

(30) Foreign Application Priority Data

Jan. 23, 2019 (CN) .......................... 201910062064.7
Jan. 23, 2019 (CN) .......................... 201920110253.2

(51) Int. Cl.
*H01J 37/34* (2006.01)
*C23C 14/35* (2006.01)
(Continued)

(52) U.S. Cl.
CPC .......... *H01J 37/3441* (2013.01); *C23C 14/35* (2013.01); *C23C 16/4585* (2013.01);
(Continued)

(58) Field of Classification Search
CPC ............... H01J 37/3405; H01J 37/3441; H01J 37/32522; H01J 2237/002;
(Continued)

(56) References Cited

U.S. PATENT DOCUMENTS 6,067,810 A 5/2000 Jennings et al.
6,442,950 B1 9/2002 Tung
(Continued)

FOREIGN PATENT DOCUMENTS

CN 203653697 U 6/2014
CN 106756872 A 5/2017
(Continued)

*Primary Examiner* — Michael A Band
(74) *Attorney, Agent, or Firm* — ANOVA LAW GROUP, PLLC

(57) ABSTRACT

A shield cooling assembly includes an adapter configured to fix a shield in the chamber. The adapter includes a first surface and a second surface facing an outer side surface of the shield and a bottom surface of a bottom wall of the shield, respectively. A predetermined gap is provided between the first surface and the outer side surface of the shield. The second surface is in contact with the bottom surface of the bottom wall of the shield. The adapter is provided with a cooling channel for transmitting a cooling medium to cool the shield.

18 Claims, 3 Drawing Sheets

(51) Int. Cl.
*C23C 16/458* (2006.01)
*H01J 37/32* (2006.01)

(52) U.S. Cl.
CPC .. *H01J 37/32522* (2013.01); *H01J 37/32651* (2013.01); *H01J 37/3405* (2013.01); *H01J 2237/002* (2013.01)

(58) Field of Classification Search
CPC ........... H01J 37/32651; H01J 37/32477; H01J 37/32495; C23C 14/35; C23C 14/54; C23C 16/4585
See application file for complete search history.

(56) References Cited

U.S. PATENT DOCUMENTS

| | | | | |
|---|---|---|---|---|
| 9,343,274 | B2* | 5/2016 | Rasheed | H01J 19/54 |
| 11,387,085 | B2* | 7/2022 | Bhat | C23C 28/023 |
| 11,952,653 | B2* | 4/2024 | Han | C23C 14/042 |
| 2014/0127404 | A1 | 5/2014 | Yudovsky et al. | |
| 2015/0354054 | A1* | 12/2015 | Fruchterman | H01J 37/3411 165/177 |
| 2021/0319985 | A1* | 10/2021 | Suzuki | C23C 14/3407 |
| 2023/0055006 | A1* | 2/2023 | Han | C23C 14/50 |

FOREIGN PATENT DOCUMENTS

| | | |
|---|---|---|
| CN | 208136325 U | 11/2018 |
| CN | 109321895 A | 2/2019 |
| CN | 109735814 A | 5/2019 |
| CN | 209890728 U | 1/2020 |
| JP | 2001240962 A | 9/2001 |
| TW | 201130397 A | 9/2011 |

* cited by examiner

SHIELD COOLING ASSEMBLY, REACTION CHAMBER AND SEMICONDUCTOR PROCESSING APPARATUS

CROSS-REFERENCE TO RELATED APPLICATIONS

This application is a continuation application of International Application No. PCT/CN2020/072184, filed on Jan. 15, 2020, which claims priority to Chinse Patent Application No. 201910062064.7, filed on Jan. 23, 2019, and Chinse Patent Application No. 201920110253.2, filed on Jan. 23, 2019. The above enumerated patent applications are incorporated herein by reference.

TECHNICAL FIELD

The disclosure relates to the technical field of semiconductor fabrication and, in particular, to a shield cooling assembly, a reaction chamber, and semiconductor processing apparatus.

TECHNICAL BACKGROUND

Physical Vapor Deposition (PVD) technology is widely used in the field of semiconductor. PVD employs sputtering deposition technology to pass inert gas, e.g., argon, between a wafer and a target. A high voltage ionizes the inert gas to generate plasma. The magnetic field enhances the ability to confine electrons so that the generated plasma bombards the target material, depositing atoms or ions of the target material on a wafer to form a thin film.

It is desirable to design reaction chambers to improve heat transfer efficiency and process quality, reduce the processing steps and reduce processing difficulty in semiconductor processing apparatus.

SUMMARY

In view of this, embodiments of the present disclosure provide a shield cooling assembly and semiconductor processing apparatus, which can solve the problems of limited cooling capacity, slow heat conduction rate, low efficiency, high cost, and high processing difficulty, etc.

One aspect of the embodiment of the present disclosure provides a shield cooling assembly, including: an adapter; the adapter is configured to fix the shield in the chamber, and the adapter has a first surface and a second surface facing an outer side surface of the shield and a bottom surface of a bottom wall of the shield, respectively. There is a predetermined gap between the first surface and the outer side surface of the shield, and the second surface contacts the bottom surface of the bottom wall of the shield. In addition, the adapter is provided with a cooling channel for transmitting a cooling medium to cool the shield.

In some embodiments, the adapter includes a cylindrical main body surrounding the shield and a supporting part connected to the cylindrical main body for supporting the bottom wall of the shield, where an inner side surface of the cylindrical main body is used as the first surface; and a surface of the supporting part that is in contact with the bottom surface of the bottom wall of the shield is used as the second surface.

The cooling channel is provided inside the cylindrical main body, or inside the cylindrical main body and the supporting part.

In some embodiments, the cooling channel includes a first channel disposed inside the cylindrical main body. The first channel surrounds in a predetermined distribution manner the cylindrical main body in a circumferential direction.

In some embodiments, the first channel surrounds the cylindrical main body in the circumferential direction and has an annular shape. One end of the first channel along an axial direction of the cylindrical main body extends to a position close to the supporting part.

In some embodiments, one end of the first channel close to the supporting part penetrates the bottom of the cylindrical main body, and an annular blocking member is further provided at the bottom of the cylindrical main body. The annular blocking member is hermetically connected to the cylindrical main body to seal the first channel.

In some embodiments, the cooling channel further includes a second channel disposed inside the supporting part and surrounding in a predetermined arrangement manner in the circumferential direction of the supporting part. The second channel communicates with the first channel.

In some embodiments, an inner diameter of the supporting part is greater than or equal to an inner diameter of the shield.

In some embodiments, the adapter further includes a fixing part connected to an end of the cylindrical main body far from the supporting part. The fixing part is configured to be fixedly connected to the chamber; the cooling channel further includes an inlet channel for the cooling medium to enter and an outlet channel for the cooling medium to exit that are arranged inside the fixing part; one end of each of the inlet channel and the outlet channel communicates with to the first channel, and the other end of each of the inlet channel and the outlet channel is located on a surface of the fixing part located outside the chamber.

In some embodiments, the inlet channel and the outlet channel are arranged obliquely with respect to the axial direction of the cylindrical main body; or the inlet channel and the outlet channel are both perpendicular to the axial direction of the cylindrical main body.

In some embodiments, the cooling channel further includes two connecting channels arranged in the cylindrical main body, and the two connecting channels are used to respectively communicate the inlet channel and the outlet channel with the first channel.

In some embodiments, a joint is provided at the other end of each of the inlet channel and the outlet channel for respectively connecting with an inlet pipeline and a return pipeline.

In some embodiments, the fixing part is arranged between the side wall of the chamber and an insulating member located above the side wall. A sealing ring is arranged between the fixing part and the side wall of the chamber, and another sealing ring is arranged between the fixing part and the insulating member.

Another aspect of the embodiments of the present disclosure provides a reaction chamber, which includes a chamber body and a shield arranged within the chamber body, and further includes the shield cooling assembly as described above.

In some embodiments, the reaction chamber includes a magnetron sputtering reaction chamber.

Another aspect of the embodiments of the present disclosure provides a semiconductor processing apparatus, including the shield cooling assembly as described above.

In the shield cooling assembly provided by the present disclosure, the adapter is provided with the cooling channel. The adapter has the first surface and the second surface facing the outer side surface of the shield and the bottom surface of the bottom wall of the shield, respectively, and both of them can conduct heat from the shield at the same time, which can not only improve the heat transfer efficiency, but also achieve uniform cooling of the shield and avoid the local temperature of the shield from being too high, thereby effectively preventing the shield from releasing impurities due to high temperature, and thus improving product quality. Moreover, by contacting the second surface with the bottom surface of the bottom wall of the shield, the thermal contact area between the adapter and the shield can be increased, and the heat transfer efficiency can be further improved, especially the heat transfer efficiency of the shield. As such, the temperature rise of the wafer near the bottom of the shield due to magnetron sputtering can be improved, and the effect on the wafer and the film caused by the temperature rise in the reaction area can be avoided. In addition, by providing the cooling channel in the adapter, it is possible to reduce the processing steps and processing difficulty, the difficulty of cleaning, and the difficulty of disassembly and assembly that is caused by the addition of the cooling pipeline. At the same time, the adapter has a simple structure and high cooling efficiency, and does not need a sealing ring to seal the cooling pipeline, thereby reducing the risk of leakage.

The reaction chamber provided by the present disclosure can not only improve heat transfer efficiency and process quality by using the above-mentioned shield cooling assembly, but also reduce the processing steps and processing difficulty, the difficulty of cleaning, and the difficulty of disassembly and assembly that is caused by the addition of the cooling pipeline.

The semiconductor processing apparatus provided by the present disclosure, by using the above-mentioned reaction chamber, can not only improve heat transfer efficiency and process quality, but also reduce the processing steps and processing difficulty, the difficulty of cleaning, and the difficulty of disassembly and assembly that is caused by the addition of the cooling pipeline.

The additional aspects and advantages of the embodiments of the present disclosure will be partly given in the following description, which will become obvious from the following description, or be understood through the practice of the present disclosure.

DESCRIPTION OF THE DRAWINGS

In order to explain the embodiments of the present disclosure or the technical solutions in the conventional technologies more clearly, the following will briefly introduce the drawings that need to be used in the description of the embodiments or the prior art. Obviously, the drawings in the following description are just some embodiments of the present disclosure. For those of ordinary skill in the art, other drawings can be obtained based on these drawings without creative labor.

DETAILED DISCLOSURE DESCRIPTION

Hereinafter, the present disclosure will be described more fully with reference to the accompanying drawings, in which exemplary embodiments of the present disclosure are illustrated. The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments of the present disclosure, all other embodiments obtained by those of ordinary skill in the art without creative work shall fall within the protection scope of the present invention. The technical solutions of the present disclosure will be described in various aspects below in conjunction with the drawings and embodiments.

For the convenience of description hereinafter, "left," "right," "upper," and "lower" referred to below are consistent with the left, right, up, and down directions of the drawings themselves. The following "first," "second," etc., are only used to distinguish descriptions, and have no other special meanings.

Figure 1:
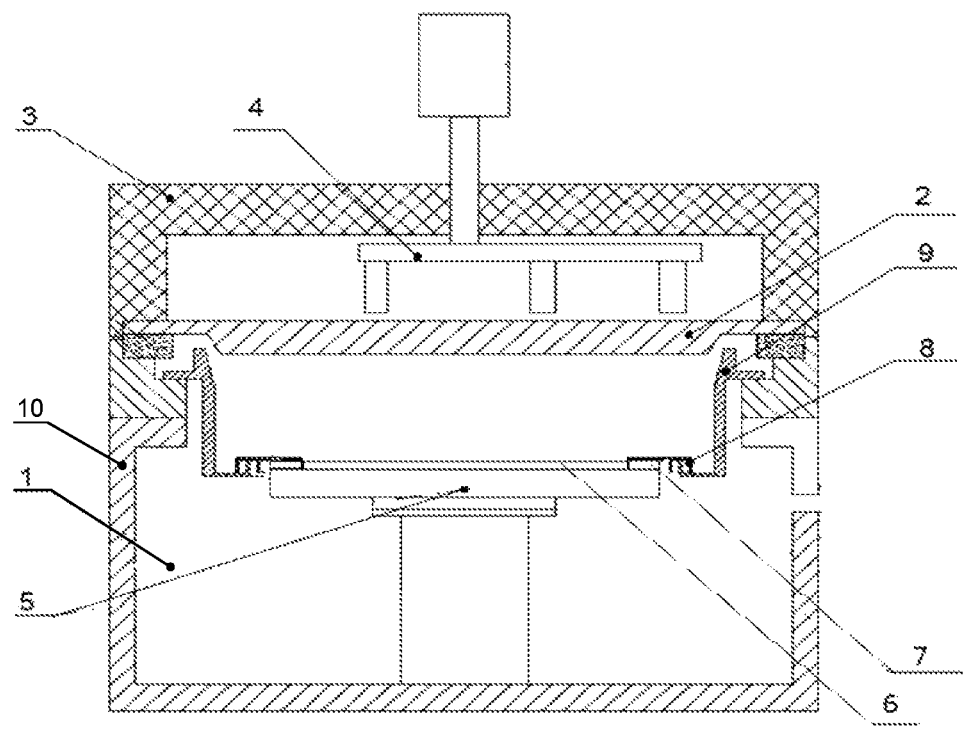
FIG. 1 is a schematic diagram of a magnetron sputtering device.

An existing magnetron sputtering apparatus is shown in FIG. 1. The apparatus includes a reaction chamber 1, a target 2 provided in the reaction chamber 1, and a susceptor 5 provided below the target 2 for carrying a wafer 6, and a cooling chamber body 3 made of insulating material provided above the target 2. Cooling water for cooling the target 2 is added to an enclosed space formed by the cooling chamber body 3 and the target 2. A rotatable magnetron 4 is also provided in the enclosed space. During a sputtering process, a power supply applies a bias voltage to the target 2 to make it a negative bias with respect to a grounded chamber body 3 of the reaction chamber 1. The negative bias can ionize the inert gas flowing into the reaction chamber 1 to form a plasma, and at the same time, can attract positively charged plasma to the target 2. When the plasma energy is high enough and bombards the target 2 under the action of the magnetic field formed by the rotating magnetron 4, metal atoms or metal ions will escape the surface of the target 2 and be deposited on the wafer 6 by diffusion.

However, even with the confining effect of the magnetron 4 on the metal atoms, a large amount of metal atoms and metal ions will still be deposited on an inner wall of the reaction chamber 1, and after falling off, will contaminate the wafer and the reaction chamber 1. Thus, a shield 9, a cover ring 8 and a deposition-ring 7 are also provided in the reaction chamber 1 to shield the metal atoms and metal ions from contaminating the reaction chamber 1. During the magnetron sputtering process, the metal ions and atoms escaping from the target 2 will carry a huge amount of heat, which will increase the temperature of the shield 9. It will not be conducive to the progress of the process if the temperature of the shield 9 exceeds the temperature range of the process reaction, and a series of problems such as substandard film stress and whisker defects may occur.

Although a variety of methods are used to perform cooling and other treatments for the shield 9, these methods have problems such as limited cooling capacity, slow heat conduction rate, low efficiency, high cost, and high processing difficulty, etc.

Figure 2:
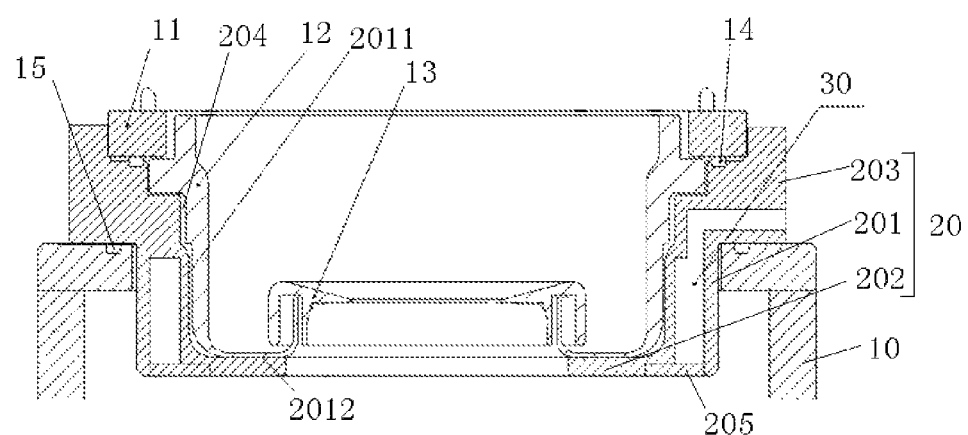
FIG. 2 is a cross-sectional view of a shield cooling assembly after installation according to an embodiment of the present disclosure.

Referring to FIG. 2, an embodiment of the present disclosure provides a shield cooling assembly, which includes an adapter 20. The adapter 20 is configured to be able to accommodate the shield 12 in a space formed by the adapter 20 and fix the shield 12 in a chamber formed by the chamber body 10. In some embodiments, the adapter 20 is connected to the shield 12 by a fixed connection, and the fixed connection includes a threaded connection or the like. For example, the shield 12 is fixed to the adapter 20 by screws. Both the adapter 20 and the shield 12 are made of metal.

The adapter 20 may have a variety of structures. In this embodiment, the adapter 20 has a first surface 2011 and a second surface 2012 facing an outer side surface of the shield 12 and a bottom surface of a bottom wall of the shield 12, respectively. There is a predetermined gap 204 between the outer side surface of the shield 12, and the second surface 2012 is in contact with the bottom surface of the bottom wall of the shield 12. In addition, the adaptor 20 includes a cooling channel 30 for transmitting a cooling medium to cool the shield.

In one embodiment, the adapter 20 includes a cylindrical main body 201 surrounding the shield 12 and a supporting part 202 connected to the cylindrical main body 201 for supporting the bottom wall of the shield 12. An inner side surface of the cylindrical main body 201 is used as the aforementioned first surface 2011, and a surface of the supporting part 202 that is in contact with the bottom surface of the bottom wall of the shield 12 is used as the aforementioned second surface 2012.

Figure 3:
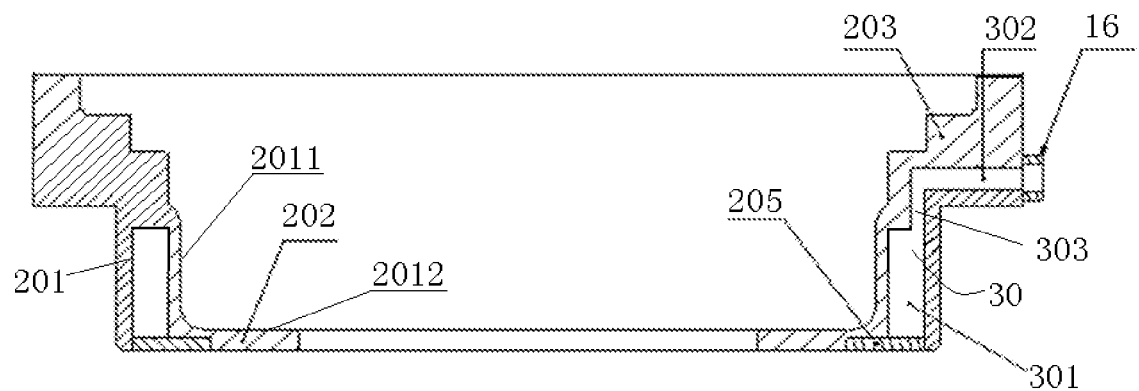
FIG. 3 is a cross-sectional view of a shield cooling assembly according to an embodiment of the present disclosure.

In one embodiment, as shown in FIG. 3, the cooling channel 30 is provided inside the cylindrical main body 201.

Figure 4:
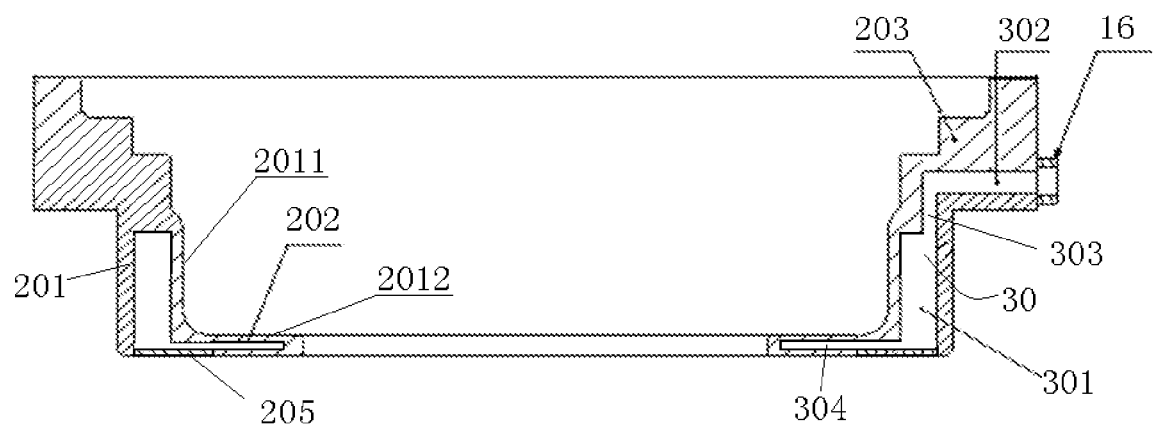
FIG. 4 is another cross-sectional view of a shield cooling assembly according to an embodiment of the present disclosure.

In another embodiment, as shown in FIG. 4, the cooling channel 30 may also be provided inside the cylindrical main body 201 and the supporting part 202.

In some embodiments, the cylindrical main body 201 and the supporting part 202 may be an integral structure, for example, manufactured by integral molding, or may be a separate structure, for example, manufactured by welding.

In one embodiment, the adapter 20 further includes a fixing part 203 connected to an end of the cylindrical main body 201 that is away from the supporting part 202, and the fixing part 203 is used for fixed connection with the chamber. In some embodiments, the fixing part 203 is provided between a side wall of the chamber body 10 and an insulating member 11 located above the side wall, that is, the fixing part 203 is located outside the chamber formed by the chamber body 10. The cylindrical main body 201 and the supporting part 202 are both located inside the chamber. In addition, a sealing ring 15 is provided between the fixing part 203 and the side wall of the chamber body 10, and a sealing ring 14 is provided between the fixing part 203 and the insulating member 11 to ensure the vacuum inside the chamber.

In some embodiments, a shape of the orthographic projection of the fixed portion 203 on a radial section of the chamber body 10 is a square, and the four corners of the square are chamfered.

In some embodiments, the fixing part 203 and the cylindrical main body 201 may be an integral structure, for example, manufactured by integral molding, or may be a separate structure, for example, manufactured by welding.

In the shield cooling assembly provided by the embodiment of the present disclosure, the adapter 20 is provided with the cooling channel 30. The first surface 2011 and the second surface 2012 of the adapter 20 can conduct heat from the side and bottom surfaces of the shield 12, respectively, at the same time. The heat transfer efficiency is improved, and uniform cooling of the shield 12 can be realized. The local temperature of the shield 12 is prevented from being too high, thereby effectively preventing the shield 12 from releasing impurities due to high temperature, thereby improving product quality. Moreover, by contacting the second surface 2012 with the bottom surface of the bottom wall of the shield 12, the thermal contact area between the adapter 20 and the shield 12 can be increased, and the heat transfer efficiency can be further improved, especially the heat transfer efficiency of the bottom of the shield 12. Therefore, the phenomenon of the temperature rise of the wafer located near the bottom of the shield 12 due to magnetron sputtering can be improved, and the effect on the wafer and the film caused by the temperature rise of the reaction area can be avoided. In addition, by providing the cooling channel 30 in the adapter 20, it is possible to reduce the processing steps and processing difficulty, the difficulty of cleaning, and the difficulty of disassembly and assembly that is caused by the addition of the cooling pipeline. At the same time, the adapter 20 has a simple structure and high cooling efficiency, and does not need a sealing ring to seal the cooling pipeline, thereby reducing the risk of leakage.

Moreover, there is a predetermined gap 204 between the first surface 2011 and the side wall of the shield 12. The size of the gap 204 meets the requirement that the adapter 20 can conduct heat transfer with the shield 12, and at the same time, reserves enough space between the adapter 20 and the shield 12, while meeting the installation conditions, to solve problems, such as the thermal expansion and deformation of the shield 12 at high temperatures. For example, the width of the gap 204 may be 0.05-0.2 mm, and within this range, the requirements for heat conduction and reserving space can be met at the same time.

In one embodiment, the supporting part 202 has a ring shape. In order to facilitate heat transfer, a thickness of the supporting part 202 cannot be too large. In addition, in order to facilitate the lifting of the wafer, the inner diameter of the supporting part 202 is not less than the inner diameter of the shield 12. After being installed in the adapter 20, the shield 12 is supported in the vertical direction by the supporting part 202. By using the supporting part 202 to support the shield 12, the bottom surface of the bottom wall of the shield 12 can be closely attached to the second surface 2012 by the action of gravity, so that the heat transfer efficiency can be improved.

In some embodiments, the inner side wall of the fixing part 203 and the outer wall of the shield 12 are positioned to ensure that they are coaxially arranged.

In one embodiment, as shown in FIG. 3, the cooling channel 30 includes a first channel 301 provided inside the cylindrical main body 201, and the first channel 301 surrounds the cylindrical main body 201 in a predetermined distribution manner. The cooling channels 30 can be arranged in various manners. In this embodiment, the first channel 301 surrounds the cylindrical main body 201 in the circumferential direction and has an annular shape. The first channel 301 extends along one end (the end facing downward in FIG. 3) of the cylindrical main body 201 in an axial direction to a position close to the supporting part 202 to achieve the purpose of improving the efficiency of heat transfer with the bottom wall of the shield 12.

The first channel 301 can have a variety of processing methods. In one embodiment, an end of the annular channel close to the supporting part 202 penetrates the bottom of the cylindrical main body 201, that is, the cylindrical main body 201 can be processed to include an annular channel with an opening facing downward and having a concave shape. An annular blocking member 205 is further provided at the bottom of the cylindrical main body 201, and the annular blocking member 205 is hermetically connected to the cylindrical main body 201 to seal the annular channel. The annular blocking member 205 is connected to the cylindrical main body 201 in a sealed manner, for example, by welding, which is stable and reliable without leakage.

In another embodiment, as shown in FIG. 4, the cooling channel 30 further includes a second channel 304. The second channel 304 is disposed inside the supporting part 202 and surrounds the supporting part 202 in a predetermined arrangement manner in the circumferential direction. In addition, the second channel 304 communicates with the first channel 301. With the help of the second channel 304, the cooling efficiency of the inner substrate portion can be further improved.

Figure 5:
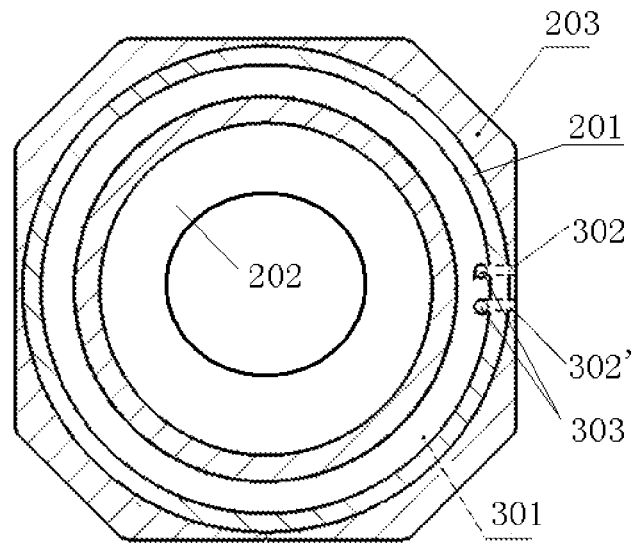
FIG. 5 is a cross-sectional view of a cooling channel of a shield cooling assembly according to an embodiment of the present disclosure.

The first channel 301 may be connected to the cooling source outside the chamber in various manners. In one embodiment, as shown in FIGS. 3 and 5, the cooling channel 30 further includes an inlet channel 302 provided in the fixing part 203 for the cooling medium to enter and an outlet channel 302' for the cooling medium to exit. One end of each of the inlet channel 302 and the outlet channel 302' is connected to the first channel 301, and the other end of each of inlet channel 302 and the outlet channel 302' is located on the surface of the fixing part 203 outside the chamber, for example, the outer side surface of the fixing part 203. For example, the inlet channel 302 and the outlet channel 302' are both perpendicular to the axial direction of the cylindrical main body 201.

In some embodiments, the cooling channel 30 further includes two connecting channels 303 arranged in the cylindrical main body 201, and the two connecting channels 303 are used to connect the inlet channel 302 and the outlet channel 302' with the first channel 301, respectively. In some embodiments, the two connecting channels 303 are parallel to the axial direction of the cylindrical main body 201. Of course, in certain embodiments, the two connecting channels 303 may also be oblique with respect to the axial direction of the cylindrical main body 201. In addition, in certain embodiments, the two connecting channels 303 may not be provided, and the inlet channel 302 and the outlet channel 302' may directly communicate with the first channel 301.

During the cooling process, the cooling medium (such as cooling water) provided by the cooling source enters the first channel 301 through, in sequence, the inlet channel 302 and a connecting channel 303 connected to the inlet channel 302, and then the cooling medium returns to the cooling source through, in sequence, another connecting channel 303 and the outlet channel 302'. In one embodiment, the inlet channel 302 and the outlet channel 302' are arranged side by side. Of course, in certain embodiments, the inlet channel 302 and the outlet channel 302' can also be oppositely arranged on two sides of the shield 12, respectively.

In one embodiment, the other end of each of the inlet channel 302 and the outlet channel 302' is provided with a joint 16 for connecting with an inlet pipeline and a return pipeline, respectively. In certain embodiments, a connection method, such as welding, and a sealing ring can be used to connect and seal the joint 16.

Figure 6:
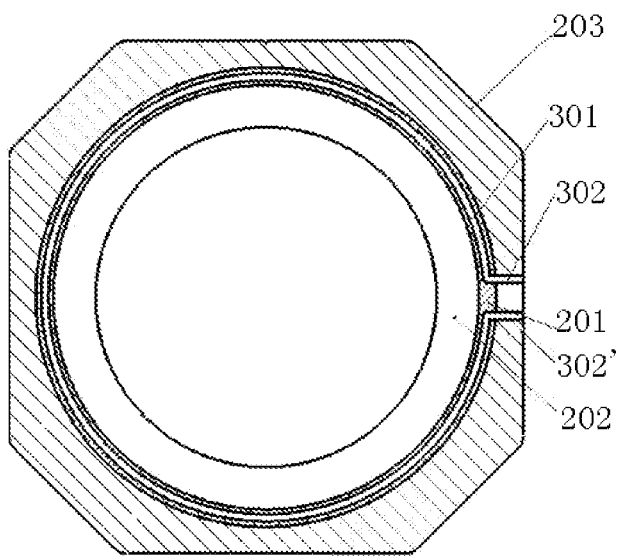
FIG. 6 is a cross-sectional view of another cooling channel of a shield cooling assembly provided according to an embodiment of the present disclosure.

In another embodiment, as shown in FIG. 6, the inlet channel 302 and the outlet channel 302' are arranged obliquely with respect to the axial direction of the cylindrical main body 201. The downwardly inclined ends of the inlet channel 302 and the outlet channel 302' both communicate with the first channel 301, while the upwardly inclined ends are located on the surface of the fixing part 203 located outside the chamber for connection with the cooling source. In addition, for the inclined inlet channel 302 and the outlet channel 302', it is also possible to choose to provide or not to provide the above-mentioned two connecting channels 303.

In certain embodiments, the arrangement of the cooling channel 30 is not limited to the above-mentioned embodiments, and can be in different manners according to the needs of the cooling part, which will not be repeated here.

In summary, in the shield cooling assembly provided by the embodiment of the present disclosure, the adapter is provided with a cooling channel. The adapter has a first surface and a second surface facing the outer side surface of the shield and the bottom surface of the bottom wall of the shield, respectively, and both of them can conduct heat from the shield at the same time, which can not only improve the heat transfer efficiency, but also achieve uniform cooling of the shield and avoid the local temperature of the shield from being too high, thereby effectively preventing the shield from releasing impurities due to high temperature, and thus improving product quality. Moreover, by making the second surface contact the bottom surface of the bottom wall of the shield, the thermal contact area between the adapter and the shield can be increased, and the heat transfer efficiency can be further improved, especially the heat transfer efficiency of the shield. As such, the temperature rise of the wafer near the bottom of the shield due to magnetron sputtering can be improved, and the effect on the wafer and the film caused by the temperature rise in the reaction area can be avoided. In addition, by providing the cooling channel in the adapter, it is possible to reduce the processing steps and processing difficulty, the difficulty of cleaning, and the difficulty of disassembly and assembly that is caused by the addition of the cooling pipeline. At the same time, the adapter has a simple structure and high cooling efficiency, and does not need a sealing ring to seal the cooling pipeline, thereby reducing the risk of leakage.

As shown in FIG. 2, an embodiment of the present disclosure also provides a reaction chamber, which includes a chamber body 10 and a shield 12 provided in the chamber body 10, and the shield cooling assembly in any of the embodiments as described above.

In one embodiment, the reaction chamber includes a magnetron sputtering reaction chamber. Of course, in certain embodiments, the reaction chamber can also be any other chamber that needs to install a shield.

In addition, the reaction chamber further includes a cover ring 13, a support structure for supporting the cover ring 13 is provided at a lower end of the shield 12, and the cover ring 13 and the shield 12 form an enclosed reaction space.

The reaction chamber provided by the present disclosure can not only improve heat transfer efficiency and process quality by using the above-mentioned shield cooling assembly, but also reduce the processing steps and processing difficulty, the difficulty of cleaning, and the difficulty of disassembly and assembly that is caused by the addition of the cooling pipeline.

In one embodiment, the embodiment of the present disclosure also provides a semiconductor processing apparatus, which includes a reaction chamber. The reaction chamber is similar to the reaction chamber in the above-mentioned embodiments.

The semiconductor processing apparatus is, for example, a PVD apparatus such as a magnetron sputtering apparatus.

The semiconductor processing apparatus provided by the present disclosure, by using the above-mentioned reaction chamber, can not only improve heat transfer efficiency and process quality, but also reduce the processing steps and processing difficulty, the difficulty of cleaning, and the difficulty of disassembly and assembly that is caused by the addition of the cooling pipeline.

Unless otherwise stated in any technical solution disclosed in the present disclosure, if the present disclosure discloses a numerical range, the disclosed numerical range is a preferred numerical range, and any person skilled in the art should understand that the preferred numerical range is only those with obvious or representative technical effects among the many feasible numerical values. Due to the large number of numerical values that cannot be exhaustively listed, the present disclosure only discloses some numerical values to illustrate the technical solutions of the present disclosure, and the above-listed numerical values should not constitute a limitation on the protection scope of the present disclosure.

At the same time, if the above-mentioned disclosure discloses or involves parts or structures that are fixedly connected to each other, unless otherwise stated, fixed connection can be understood as: a fixed connection that can be detached (for example, connected by bolts or screws), or can be understood as: non-detachable fixed connection (such as riveting, welding). Of course, the mutual fixed connection (except that it is obviously impossible to use a one-piece forming process) can also be replaced by an integrated structure (such as using a casting process to form one piece).

In addition, unless otherwise stated, the terms used in any of the technical solutions disclosed in the present disclosure to indicate a positional relationship or shape include a state or shape approximate, similar to, or close thereto, unless otherwise stated. Any component provided by the present disclosure can be assembled from a plurality of separate components, or can be a single component manufactured by an integral forming process.

The above embodiments are only used to illustrate the technical solutions of the present disclosure and not to limit them. Although the present disclosure has been described in detail with reference to the preferred embodiments, those of ordinary skill in the art should understand that specific implementation of the present invention can still be modified or some technical features can be equivalently replaced; and without departing from the spirit of the technical solution of the present disclosure, all of them shall be covered in the scope of the technical solution claimed by the present disclosure.

The description of the present disclosure is given for the sake of example and description, and is not exhaustive or limiting the present disclosure to the disclosed form. Many modifications and changes are obvious to those of ordinary skill in the art. The embodiments are selected and described in order to better illustrate the principles and certain embodiments of the present disclosure, and to enable those of ordinary skill in the art to understand the present disclosure so as to design various embodiments with various modifications suitable for specific purposes.

What is claimed is:

1. A shield cooling assembly, comprising:
an adapter configured to fix a shield in a chamber, the adapter including a first surface, a second surface, a fixing part, a cylindrical main body surrounding the shield, and a supporting part connected to the cylindrical main body for supporting a bottom wall of the shield, the fixing part, the cylindrical main body, and the supporting part forming an integral structure,
wherein:
an inner side surface of the cylindrical main body serves as the first surface;
a surface of the supporting part that is in contact with a bottom surface of the bottom wall of the shield serves as the second surface;
the first surface and the second surface face an outer side surface of the shield and the bottom surface of the bottom wall of the shield;
a predetermined gap is provided between the first surface and the outer side surface of the shield;
the second surface is in contact with the bottom surface of the bottom wall of the shield;
the adapter is provided with a cooling channel for transmitting a cooling medium to cool the shield;
the cooling channel is provided inside the cylindrical main body and the supporting part;
the cooling channel includes a first channel disposed inside the cylindrical main body;
an annular blocking member is provided at the bottom of the cylindrical main body, and is hermetically connected to the cylindrical main body to seal the first channel;
the shield contacts the fixing part; and
the fixing part is arranged between a side wall of the chamber and an insulating member located above the side wall to form a closed space to enclose the shield, the first surface, and the second surface in the chamber.

2. The shield cooling assembly of claim 1, wherein:
the first channel surrounds the cylindrical main body in a predetermined distribution manner in a circumferential direction.

3. The shield cooling assembly of claim 2, wherein:
the first channel surrounds the cylindrical main body in the circumferential direction and has an annular shape; and
one end of the first channel extends to a position adjacent to the supporting part along an axial direction of the cylindrical main body.

4. The shield cooling assembly of claim 3, wherein:
an end of the first channel next to the supporting part penetrates a bottom of the cylindrical main body.

5. The shield cooling assembly of claim 2, wherein:
the cooling channel further includes a second channel arranged inside the supporting part and surrounding the supporting part in a predetermined arrangement manner, the second channel communicating with the first channel.

6. The shield cooling assembly of claim 1, wherein an inner diameter of the supporting part is greater than or equal to an inner diameter of the shield.

7. The shield cooling assembly of claim 2, wherein:
the fixing part is connected to an end of the cylindrical main body that is away from the supporting part and configured to be fixedly connected with the chamber; and
the cooling channel further includes:
an inlet channel provided in the fixing part for the cooling medium to enter; and
an outlet channel for the cooling medium to exit;
wherein:
one end of each of the inlet channel and the outlet channel communicates with the first channel; and another end of each of the inlet channel and the outlet channel is located on a surface of the fixing part located outside the chamber.

8. The shield cooling assembly of claim 7, wherein:
the inlet channel and the outlet channel are arranged obliquely with respect to an axial direction of the cylindrical main body; or
the inlet channel and the outlet channel are both perpendicular to the axial direction of the cylindrical main body.

9. The shield cooling assembly of claim 8, wherein the cooling channel further includes two connecting channels arranged in the cylindrical main body, one of the two connecting channels being configured to communicate the inlet channel with the first channel, and the other one of the two connecting channels being configured to communicate the outlet channel with the first channel.

10. The shield cooling assembly of claim 7, wherein:
a joint is provided at the another end of each of the inlet channel and the outlet channel to connect with an inlet pipeline and a return pipeline, respectively.

11. The shield cooling assembly of claim 7, wherein a sealing ring is provided between the fixing part and the side wall of the chamber, and a sealing ring is provided between the fixing part and the insulating member.

12. A reaction chamber comprising:
a chamber body;
a shield arranged within the chamber body; and
a shield cooling assembly including an adapter configured to fix the shield in the reaction chamber, the adapter including a first surface, a second surface, a fixing part, a cylindrical main body surrounding the shield, and a supporting part connected to the cylindrical main body for supporting a bottom wall of the shield, the fixing part, the cylindrical main body, and the supporting part forming an integral structure;
wherein:
an inner side surface of the cylindrical main body serves as the first surface;
a surface of the supporting part that is in contact with a bottom surface of the bottom wall of the shield serves as the second surface;
the first surface and the second surface face an outer side surface of the shield and the bottom surface of the bottom wall of the shield;
a predetermined gap is provided between the first surface and the outer side surface of the shield;
the second surface is in contact with the bottom surface of the bottom wall of the shield;
the adapter is provided with a cooling channel for transmitting a cooling medium to cool the shield;
the cooling channel is provided inside the cylindrical main body and the supporting part;
the cooling channel includes a first channel disposed inside the cylindrical main body;
an annular blocking member is provided at the bottom of the cylindrical main body, and is hermetically connected to the cylindrical main body to seal the first channel;
the shield contacts the fixing part; and
the fixing part is arranged between a side wall of the chamber body and an insulating member located above the side wall to form a closed space to enclose the shield, the first surface, and the second surface in the reaction chamber.

13. The reaction chamber of claim 12, wherein the reaction chamber includes a magnetron sputtering reaction chamber.

14. The reaction chamber of claim 12, wherein:
the first channel surrounds the cylindrical main body in a predetermined distribution manner in a circumferential direction.

15. The reaction chamber of claim 14, wherein:
the first channel surrounds the cylindrical main body in the circumferential direction and has an annular shape; and
one end of the first channel extends to a position adjacent to the supporting part along an axial direction of the cylindrical main body.

16. The reaction chamber of claim 15, wherein:
an end of the first channel next to the supporting part penetrates a bottom of the cylindrical main body.

17. The reaction chamber of claim 14, wherein:
the fixing part is connected to an end of the cylindrical main body that is away from the supporting part and configured to be fixedly connected with the chamber; and
the cooling channel further includes:
an inlet channel provided in the fixing part for the cooling medium to enter; and
an outlet channel for the cooling medium to exit;
wherein:
one end of each of the inlet channel and the outlet channel communicates with the first channel; and
another end of each of the inlet channel and the outlet channel is located on a surface of the fixing part located outside the chamber.

18. A semiconductor processing apparatus comprising: a reaction chamber including:
a chamber body;
a shield arranged within the chamber body; and
a shield cooling assembly including an adapter configured to fix the shield in the reaction chamber, the adapter including a first surface, a second surface, a fixing part, a cylindrical main body surrounding the shield, and a supporting part connected to the cylindrical main body for supporting a bottom wall of the shield, the fixing part, the cylindrical main body, and the supporting part forming an integral structure;
wherein:
an inner side surface of the cylindrical main body serves as the first surface;
a surface of the supporting part that is in contact with a bottom surface of the bottom wall of the shield serves as the second surface;
the first surface and the second surface face an outer side surface of the shield and the bottom surface of the bottom wall of the shield;
a predetermined gap is provided between the first surface and the outer side surface of the shield;
the second surface is in contact with the bottom surface of the bottom wall of the shield;
the adapter is provided with a cooling channel for transmitting a cooling medium to cool the shield;
the cooling channel is provided inside the cylindrical main body and the supporting part;
the cooling channel includes a first channel disposed inside the cylindrical main body;
an annular blocking member is provided at the bottom of the cylindrical main body, and is hermetically connected to the cylindrical main body to seal the first channel;

the shield contacts the fixing part; and the fixing part is arranged between a side wall of the chamber body and an insulating member located above the side wall to form a closed space to enclose the shield, the first surface, and the second surface in the reaction chamber.

* * * * *